United States Patent
Ishidu et al.

(10) Patent No.: US 7,335,925 B2
(45) Date of Patent: Feb. 26, 2008

(54) SEMICONDUCTOR DEVICE

(75) Inventors: Sadamu Ishidu, Itami (JP); Kenjiro Higaki, Itami (JP); Takashi Ishii, Itami (JP); Yasushi Tsuzuki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/539,926

(22) PCT Filed: Mar. 8, 2004

(86) PCT No.: PCT/JP2004/002982

§ 371 (c)(1),
(2), (4) Date: Jun. 14, 2005

(87) PCT Pub. No.: WO2004/082034

PCT Pub. Date: Sep. 23, 2004

(65) Prior Publication Data

US 2006/0118808 A1     Jun. 8, 2006

(30) Foreign Application Priority Data

Mar. 14, 2003   (JP)   ............................. 2003-069711

(51) Int. Cl.
*H01L 33/00*   (2006.01)
(52) U.S. Cl. ......................................... 257/99; 257/100
(58) Field of Classification Search ................ 257/100, 257/99
See application file for complete search history.

(56) References Cited

U.S. PATENT DOCUMENTS 6,762,496 B2 * 7/2004 Yamamoto et al. ......... 257/753

6,961,190 B1 * 11/2005 Tamaoki et al. ............ 359/726

FOREIGN PATENT DOCUMENTS

| JP | 59-228778 B2 | 12/1984 |
|---|---|---|
| JP | 60-74485 A | 4/1985 |
| JP | 10-150227 A | 6/1998 |
| JP | 11-26647 A | 1/1999 |

(Continued)

OTHER PUBLICATIONS

PCT International Preliminary Report on Patentability for PCT/JP2004/002982 mailed Mar. 2, 2006.

(Continued)

*Primary Examiner*—Thien F Tran
(74) *Attorney, Agent, or Firm*—Darby & Darby P.C.

(57) ABSTRACT

A semiconductor device for adequately removing heat generated by a semiconductor element is provided. A semiconductor device 100 is equipped with a substrate 2, having a bottom surface 2b and an element mounting surface 2a which is positioned on the opposite side of bottom surface 2b, and a semiconductor element 1, having a main surface 1a which is mounted onto element mounting surface 2a. With L being the length in the long direction of main surface 1a and H being the distance between bottom surface 2b and element mounting surface 2a, the ratio H/L is 0.3 or greater. When the semiconductor element is a light emitting element, element mounting surface 2a is a cavity 2u, and element 1 is provided in cavity 2u. A metal layer 13 is provided on the surface of cavity 2u.

9 Claims, 4 Drawing Sheets

FOREIGN PATENT DOCUMENTS

| | | |
|---|---|---|
| JP | 2001-168444 | 6/2001 |
| JP | 2001-203386 | 7/2001 |
| JP | 2002-232017 A | 8/2002 |
| JP | 2002-359403 | 12/2002 |
| JP | 2003-17754 A | 1/2003 |
| JP | 2003-066287 | 3/2003 |
| WO | WO-02/103813 | 12/2002 |

OTHER PUBLICATIONS

International Search Report for PCT/JP/2004/002982 mailed on Apr. 13, 2004.

Patent Abstracts of Japan for 10-150227 A published on Jun. 2, 1998.

Patent Abstracts of Japan for 2003-17754 A published on Jan. 17, 2003.

Patent Abstracts of Japan for 11-26647 A published on Jan. 29, 1999.

Patent Abstracts of Japan for 60-74485 A published on Apr. 26, 1985.

Patent Abstracts of Japan for 59-228778 (4-36473) published on Dec. 22, 1984.

Patent Abstracts of Japan for 2002-232017 published on Aug. 16, 2002.

* cited by examiner

SEMICONDUCTOR DEVICE

CROSS-REFERENCE TO PRIOR APPLICATION

This is a U.S. National Phase application under 35 U.S.C. §371 of International Patent Application No. PCT/JP2004/002982 filed Mar. 8, 2004, and claims the benefit of Japanese Patent Application No. 2003-069711, filed Mar. 14, 2003, both of which are incorporated by reference herein. The International Application was published in Japanese on Sep. 23, 2004 as WO 2004/082034 A1 under PCT Article 21(2).

TECHNICAL FIELD

The present invention relates to a semiconductor device. In particular, the present invention relates to a semiconductor device equipped with a semiconductor light emitting element such as a semiconductor laser or a light emitting diode or the like.

BACKGROUND ART

As there has been demand for increasing performance in semiconductor devices, there has also been a dramatic increase in the amount of heat generated by the semiconductor elements mounted on semiconductor devices. The same is true for semiconductor light emitting display devices such as semiconductor lasers, light emitting diodes, and the like. Therefore, the material onto which the semiconductor element is mounted preferably has the same coefficient of thermal expansion as the semiconductor element and has a high thermal conductivity. One example of a semiconductor device with an improved heat releasing construction is disclosed in Japanese Examined Patent Number 4-36473. This substrate is a composite material having main components of copper, tungsten, and molybdenum. Its coefficient of thermal expansion is close to that of the mounted semiconductor light emitting element at 5.0 to $8.5 \times 10^{-6}$/K. In addition, its thermal conductivity is high at 200 W/m-K or greater. With the present invention, elements will be represented by their chemical symbols with copper as Cu, tungsten as W, and the like. In addition, with the invention disclosed in Japanese Laid-Open Patent Number 2002-232017, although the object of the invention is to improve the light emitting efficiency of the semiconductor device, the substrate, which is provided with a conductive part, is a flat board-shaped ceramic with a high thermal conductivity. However, depending on the field of application, with these semiconductor devices, including these types of light emitting devices, there is a demand for high output from the semiconductor element. As a result, there has been a trend toward increased size of the semiconductor element, and the amount of heat generation has also dramatically increased. Particularly with semiconductor devices with semiconductor light emitting elements, there has been a dramatic increase in the amount of light emission, and a concomitant increase in the size of the element and dramatic increase in the heat generation. As a result, there is a need for new means for improving the heat release efficiency around the heat generating area of the semiconductor device.

DISCLOSURE OF INVENTION

In order to solve the above problems, the present inventors have researched the construction of the area around the semiconductor element. The present invention provides a semiconductor device comprising a semiconductor element, and a substrate which has an upper surface onto which the element is mounted and a bottom surface which is positioned on the opposite side. With L being the length of the long edge of the main surface of the semiconductor element and H being the distance from the semiconductor element mounting part on the upper surface of the substrate to the bottom surface, the ratio H/L is 0.3 or greater. With this invention, the heat generated by the semiconductor element is adequately released, and the lifespan of the semiconductor device is extended. In addition to the above, the semiconductor device of the present invention has a semiconductor element which is a light emitting element. The part of the heat releasing substrate on which this light emitting element is mounted is formed as a cavity. In addition, a metal layer is formed on the top surface. With this, the heat releasing property is improved, and in addition, the light from the light emitting element is reflected by the metal layer, and the light emitting efficiency of the device is improved. Furthermore, in addition to the above, with the semiconductor device of the present invention, a connection member which connects between the light emitting element and the terminal plates for power supply are placed at a position separated from the cavity, and a means for preventing the connection member from invading the cavity is provided on the upper surface next to the connection member. With this, the connection member does not cover the metal layer in the cavity, and a reduction in the light emitting efficiency of the device is precluded.

BEST MODE FOR CARRYING OUT THE INVENTION

Figure 1:
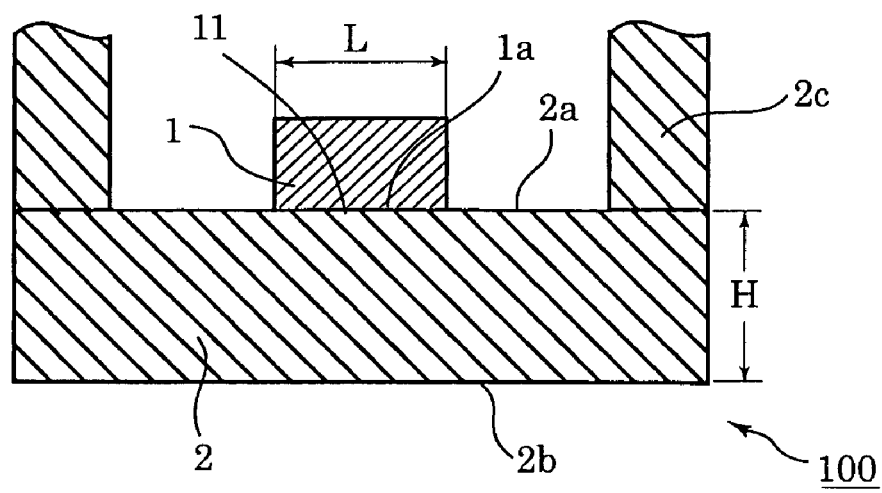
FIG. 1 is a cross-sectional diagram showing an example of a semiconductor device according to an Implementation mode 1 of the present invention.

Referring to the drawings, the implementation modes of the present invention are described below. In the following implementation modes, parts that are the same or are corresponding parts are given the same reference numbers, and their descriptions are not repeated.

(Implementation Mode 1)

Figure 2:
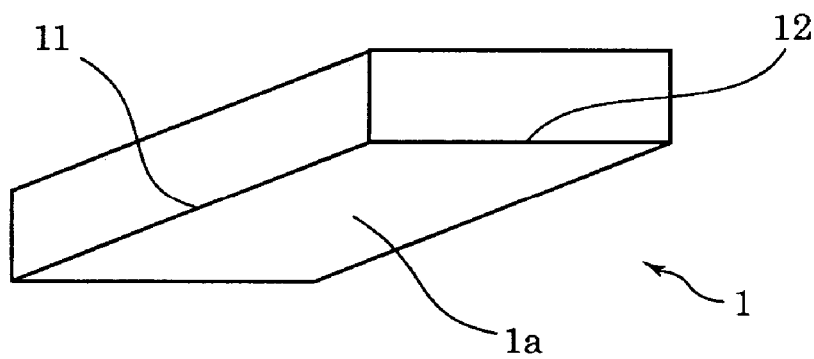
FIG. 2 is a perspective view showing one mode of a semiconductor element represented in FIG. 1.
Figure 3A:
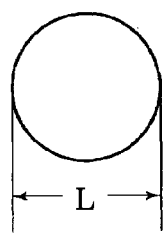
FIG. 3 is a perspective view showing another mode of a semiconductor element shown in FIG. 1.
Figure 3B:
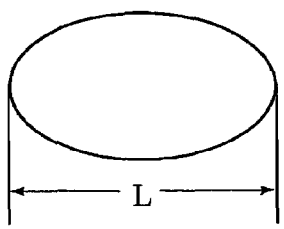
Figure 3C:
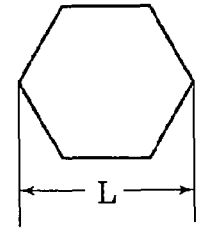
Figure 3D:
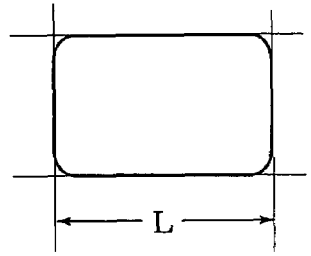
Figure 3E:
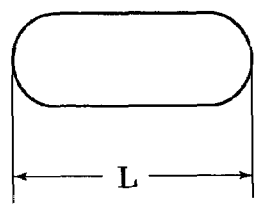

Referring to FIG. 1, there is a cross-section representing an example of a semiconductor device according to Implementation mode 1 of the present invention. FIG. 2 is a perspective view showing one mode of the semiconductor element represented in FIG. 1. In a semiconductor device 100 of FIG. 1, there is a semiconductor element 1 having a main surface 1a. There is a substrate 2 which is integrated with a frame part 2c on which the element is mounted. Substrate 2 has an upper surface 2a and a lower surface 2b. There is a distance H between these two surfaces. Main surface 1a of semiconductor element 1 is opposite upper surface 2a of substrate 2. In the present situation, main surface 1a is a rectangle. The length of the long side of main surface 1a is a length L, corresponds to that of long side 11. The length in the short side direction corresponds to that of short side 12. This is the same for other implementation modes, but if main surface 1a is rectangular, normally, the surface of the other side is approximately the same shape. However, this does not always have to be the case. As shown in FIG. 3, there are examples of the main surface being other than a rectangle. The length in the long direction of the main surface of the semiconductor element of the present invention is measured from the outline of an image projected in a direction perpendicular to the main surface. Examples are shown in FIGS. 3A through 3E. The part displayed as L is the length in the long direction. For example, if it is a circle or square, length L is the diameter or the length of one of its sides, respectively. If it is an ellipse, it is the length of the major axis. The distance between the upper surface and the lower surface of the substrate is H. In the semiconductor device of the present invention, ratio H/L is 0.3 or greater. Preferably ratio H/L is 0.45 to 1.5, and more preferably it is between 0.5 and 1.25.

Figure 4:
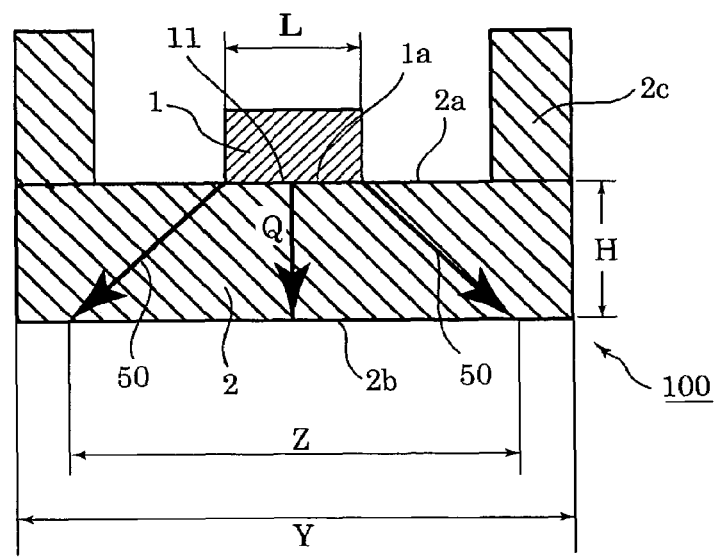
FIG. 4 is a cross-sectional diagram of a semiconductor device describing heat release.

Although it is the same for the other implementation modes, FIG. 4 is a cross-sectional diagram of a semiconductor device for schematically describing the release of heat. When a heat Q is generated from semiconductor light emitting element 1, as shown by arrows 50, the heat spreads within substrate 2 and is transmitted to bottom surface 2b of substrate 2. By making distance Z larger, the area contributing to the heat release of bottom surface 2b of substrate 2 is enlarged. In other words, the heat generated from semiconductor light emitting element 1 is efficiently released. In order to increase distance Z, distance H must be increased. As a result, in the present invention, distance H is increased, and the amount of heat release from bottom surface 2b is increased. In addition, in order to have a reliable heat release effect, distance Y is preferably 2 times or greater the length L of first side 11.

Although it is the same for the other implementation modes, substrate 2 is a heat releasing member. The material will depend on the package design according to the needs of the semiconductor device. In addition to packaging the semiconductor device, there is also the need for ease of manufacturing, light weight, and a long usage lifespan. However, as described previously, the most important properties are that the heat expansion factor be similar to that of the semiconductor element and that it has a high heat conductivity. The heat conductivity of the substrate of the present invention is 170 W/m-K or greater, and preferably 200 W/m-K or greater.

The material of the substrate is (1) various inorganic and organic materials and their compounds, (2) composite material in which these various inorganic and organic materials are microscopically mixed without being chemically combined. (3) combined material in which these materials are macroscopically combined.

For the inorganic materials of (1), examples include: semi-metals such as carbon (for example, graphite, diamond), Si, and the like; metal materials having as the main components Al, Cu, Ag, Au, and transition metals of Groups 4a through 7a, 8a of the periodic table; compounds of semi-metals and metals such as TiC, ZrN, and the like; compounds of semi-metals such as SiC, $B_4C$, and the like; compounds of semi-metals and non-metals such as $Si_3N_4$ and BN and the like; and compounds of metals and semi-metals such as AlN. For the organic materials, these are compounds present in living organisms, in the natural world, and those which are synthesized. Examples include DNA, enzymes, natural or synthetic rubber, fibers, resin, organic metal compounds, and the like.

For (2), the various materials of (1) are microscopically mixed and dispersed or arranged. For example, there are various composite materials, such as Cu—W, Cu—Mo, Al—SiC, Al—AlN, Ag—C, Si—SiC, and the like. For (3), some of the materials from (1) and (2) are combined in bulk. This can take many forms. Examples include: layered bodies of Cu and Mo, Al and SiC, and the like; board-shaped examples with the middle part being Cu and the outer perimeter being Cu—Mo; functionally layered examples in which there is a gradient with the amount of Cu changing in the thickness direction of a Cu—Mo layer, and the like. These are created as appropriate depending on the package design. We will introduce implementation examples of representative substrates below.

For example, with composite material of Cu—W or Cu—Mo as described previously, when the Cu content is in the range of 5 to 40% by mass, the coefficient of thermal expansion is normally 5 to $12 \times 10^{-6}$/K. In addition, when using composite material with a main component of Al—SiC for substrate 2, when the SiC content is in the range of 10 to 70% by mass, the coefficient of thermal expansion is in the range of 8 to $20 \times 10^{-6}$/K. With the assumption of using a semiconductor element 1 of GaN, GaAs, InP, or Si, their coefficients of thermal expansion are in the range of 3 to $7 \times 10^{-6}$/K. Therefore, it is preferred to have the coefficient of thermal expansion close to this range. Therefore, with composite material of Cu—W or Cu—Mo, the Cu content is preferably in the range of 5 to 40% by mass, more preferably in the range of 10 to 35% by mass, and even more preferably in the range of 10 to 20% by mass. For these composite materials, a molded body with a main component of W or Mo powder is made, or this is further sintered, and a porous body is created. Cu is infiltrated into the pores (infiltrating method). Alternatively, a mixture of powder with main components of Cu and W or Cu and Mo is molded, and this is sintered (sintering method). In addition, for example, when a composite material of Al—SiC is used for the substrate, the Al content is preferably in the range of 25 to 35% by mass. This material is manufactured by the following methods: a casting method in which SiC powder is dispersed in Al molten solution and cooled; an infiltration method in which Al is infiltrated into the pores of a porous body having a main component of SiC; a sintering method in which after molding a mixture having main components of Al powder and SiC powder, this is sintered.

In addition, although not shown in the figures, in order to form an electrical connection with semiconductor element 1, a connection means, such as a bonding wire, flip chip, via hole, and the like, is provided between substrate 2 and semiconductor element 1.

Although it is the same for the other implementation modes of the present invention, a metal layer 13 is formed on element mounting surface 2a of substrate 2 for connection with the semiconductor element or for electrifying the element. In this situation, in order for the metal layer to have adequate joining strength, the surface roughness of surface 2a preferably has a maximum roughness by JIS standards (JIS B 0601) of Rmax in a range of 0.1 to 20 micrometers.

When the maximum roughness is less than 0.1 micrometers, an anchoring effect is difficult to achieve when forming the metal layer. On the other hand, when Rmax exceeds 20 micrometers, the amount of adsorbed gas such as oxygen and the like on surface 2a increases, and the amount of gas released when forming the metal layer increases, and the degree of vacuum needed for film formation is difficult to achieve. More preferably, Rmax is between 0.1 micrometers and 8 micrometers. When Rmax exceeds 8 micrometers, holes are easily generated during joining, and there can be unevenness in joining strength.

With the semiconductor device of the present invention, by having the dimensions of the substrate and the main surface of the semiconductor element within a prescribed range as described above, the heat generated by the element is released smoothly. With this, the effects of excess temperature rise by the element, such as reduction in output of the semiconductor device or the deterioration of members near the element, is reduced greatly. Increased output from the device and extended usage life is possible.

(Implementation Mode 2)

Figure 5:
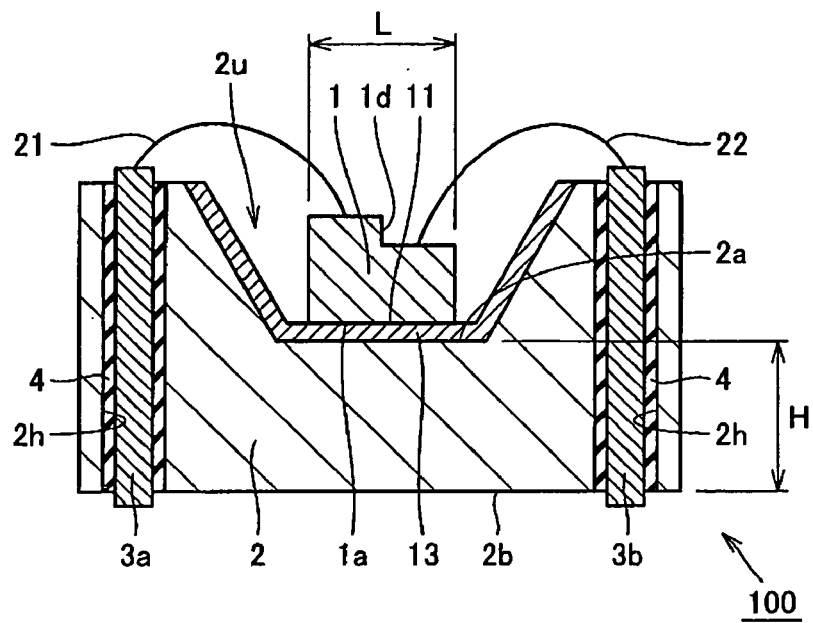
FIG. 5 is a cross-sectional diagram showing an example of a semiconductor device according to an Implementation mode 2 of the present invention.

Referring to FIG. 5, there is shown a cross-section of a semi-conductor device according to Implementation mode 2 of the present invention. In this situation, semiconductor element 1 is a light emitting element. The design of device 100 is controlled as described above with regard to H/L. Metal layer 13 is formed on element mounting surface 2a and is preferably formed with the surface form as described above. With this implementation mode, the metal layer has a role of reflecting light emitted by light emitting element 1. As a result, the metal layer is normally constructed from a metal with a high reflectance such as silver or aluminum or from a metal having a main component of a high reflectance metal. Metal layer 13 is formed by plating or vapor deposition so that it covers the element mounting surface. The metal layer may be formed on other parts, not just the element mounting surface, or it may be formed on the entire surface of substrate 2. When the substrate body is conductive, for example if it is of a metal material or the like, bright silver plating by an electroplating method is preferred. In addition, if the reflectance of the element mounting surface itself is high, there does not have to be a metal layer. In addition, in FIG. 5, metal layer 13 is provided in a cavity 2u, but it is also possible to use a substrate 2 without cavity 2u and have metal layer 13 provided on element mounting surface 2a of substrate 2.

The thickness of substrate 2, or in other words the distance H from bottom surface 2b to element mounting surface 2a, can be established according to the dimensions of semiconductor light emitting element 1. For example, distance H can be 0.3 mm or greater and 10 mm or less.

Semiconductor light emitting element 1 is provided so that it contacts metal layer 13. The element is constructed from a compound semiconductor light emitting element of the II-VI group or III-V group, such as ZnSe, GaAs, GaP, GaN, InP, and the like. Here, group II elements include zinc (Zn) and cadmium (Cd). Group III elements include boron (B), aluminum (Al), gallium (Ga), and indium (In). Group V elements include nitrogen (N), phosphorus (P), arsenic (As), and antimony (Sb). Group VI elements include oxygen (O), sulfur (S), selenium (Se), and tellurium (T). These compound semiconductors can be formed on top of a substrate of sapphire or the like.

Substrate 2 can be constructed from a Fe—Ni alloy or Fe—Ni—Co alloy, for example. In addition, there can be an intermediate layer (not shown) provided between element mounting surface 2a and metal layer 13. For the intermediate layer, examples include Ni, Ni—Cr, Ni—P, Ni—B, Ni—Co, Cu, and Au, and the like. These are formed by plating. When forming by vapor deposition, examples include Ti, V, Cr, Ni, NiCr alloy, Cu, W, Zr, Nb, and Ta, and the like. In addition, the intermediate layer can be multi-layered with a plating layer and/or vapor deposition layer described above. The thickness of the intermediate layer is preferably 0.01 to 5 micrometers, and more preferably 0.1 micrometers to 1 micrometer.

Figure 6:
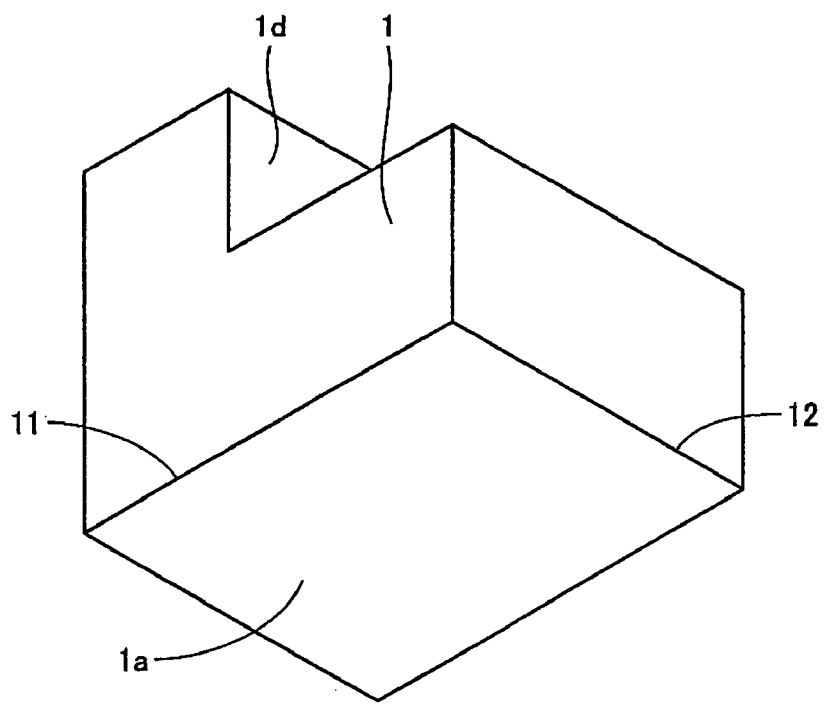
FIG. 6 is a perspective view showing one mode of a semiconductor light emitting element shown in FIG. 5.

In this implementation mode, the relationship between length L in the long direction of main surface 1a of the semiconductor element and the distance H between the upper surface and lower surface of substrate 2 is the same as in the previous implementation mode. FIG. 6 shows a perspective view of the semiconductor element of this implementation mode. In this situation, the element has a step part 1d, but this can be eliminated. Side 11 is the long side of semiconductor light emitting element 1, and side 12 is the short side. In this situation, the length of side 11 corresponds to length L. and extends approximately perpendicular to step part 1d of light emitting element. Side 12 extends approximately parallel to the step part. There are situations when sides 11 and 12 are approximately the same length. When main surface 1a is not rectangular, it is as described previously. For example, even if main surface 1a is rectangular but with rounded corners, an extrapolation line is drawn along the outline projection of main surface 1a, and this is determined to be long side L.

In this implementation mode, with semiconductor light emitting element 1, power is supplied from main surface 1a and/or from the side opposite of main surface 1a. Light is emitted from a light emitting layer (not shown) provided within semiconductor light emitting element. Semiconductor light emitting element can be a light emitting diode, or it can be a semiconductor laser. In addition, the wavelength of the light generated by semiconductor light emitting element is not particularly limited.

There are holes 2h which pass through substrate 2. Holes 2h are approximately cylindrical in shape. On the inside of holes 2h, there are an insulating glass 4 and pins 3a and 3b. Pins 3a and 3B supply power to semiconductor light emitting element 1 and are constructed from stainless steel (SUS) or a Fe—Co—Ni alloy. In addition, as long as the electrical resistance is small, pins 3a and 3b can be formed from other compositions. Insulating glass 4 is provided for positioning of pins 3a and 3b inside holes 2h. Insulating glass 4 fills holes 2h and also has the function of insulating pins 3a and 3b and substrate 2.

Bonding wires 21 and 22 electrically connect pins 3a and 3b with semiconductor light emitting element 1. The power supplied from pins 3a and 3b is supplied to semiconductor light emitting element 1 via bonding wires 21 and 22. Bonding wires 21 and 22 can be constructed from gold, aluminum, or their alloys.

In order to have increased output for semiconductor light element 1, the length in the long direction, in other words, the length L of the long side is preferably 1 mm or greater, or the surface area of main surface 1a is preferably 1 mm$^2$ or greater.

If the heat generated from semiconductor light emitting element 1 is not adequately released to the exterior and removed, the temperature of the element itself rises. This could result in reduced light emitting efficiency, and it may lead to shifting of wavelengths of light so that light is no longer being emitted at a constant color. Furthermore, due to the heat, peripheral members such as fluorescent bodies and the like can deteriorate. As a result of the above, the lifespan of the semiconductor device is shortened. In particular, when length L of the light emitting element exceeds 1 mm, the temperature in the central part of the element tends to rise, and its lifespan is shortened. In the semiconductor device of the present implementation mode, because H/L is optimized, an adequate release of heat is conducted, and the above problems are kept in check.

In addition, with Implementation mode 2, in addition to the above improvements in heat release, the light from the light emitting element is reflected by the metal layer, and the light output of the device is increased.

(Implementation Mode 3)

Figure 7:
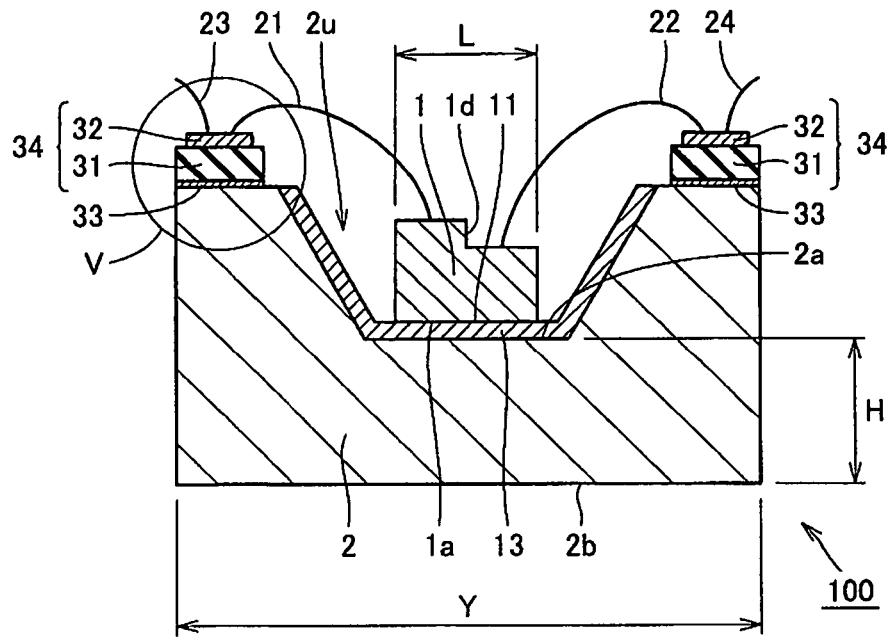
FIG. 7 is a cross-section showing an example of a semiconductor device according to Implementation mode 3 of the present invention.
Figure 8:
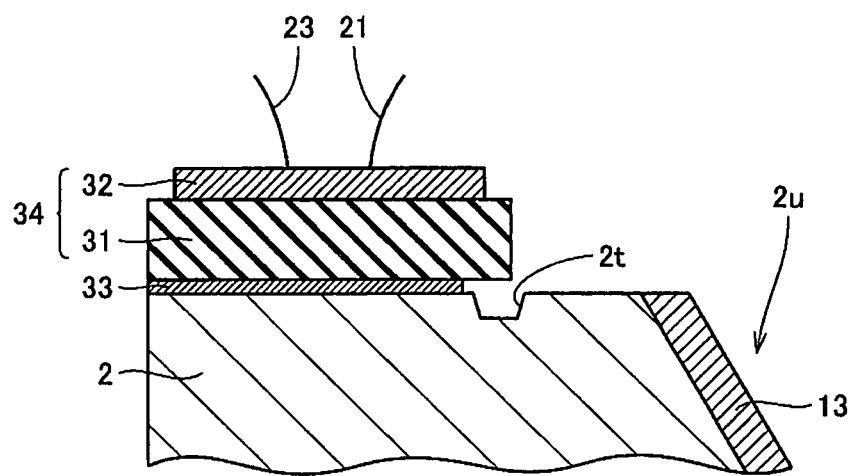
FIG. 8 is a diagram representing an enlarged cross-section of one mode of the area indicated by V in FIG. 7.

FIG. 7 shows a cross-section of a semiconductor device according to Implementation mode 3 of the present invention. FIG. 8 is a cross-section showing an enlargement of the area within circle V of FIG. 7. The design of this semiconductor device is controlled as described above with regard to H/L. A metal layer is formed on the element mounting surface and is preferably formed with the surface form as described above. The metal layer has a role of reflecting light emitted by light emitting element 1. As shown in FIG. 7, unlike with Implementation mode 2, semiconductor device 100 of this implementation mode has no pins. A connection member 33 is provided on top of substrate 2. A terminal plate 34, which is formed from an insulating plate 31 and an electrode 32, is affixed to substrate 2 by connection member 33. Connection member 33 is a solder or an adhesive for example. A groove 2t is formed on substrate 2 in order to prevent connection member 33 from flowing into cavity 2u. If connection member 33 flows into cavity 2u, this results in surface unevenness in cavity 2u, and the light reflectance is reduced. Other means may be used as long as the same object is achieved. For example, there can be an area with bumps. Insulating plate 31 is constructed from ceramic, for example. However, instead of insulating plate 31, an insulating film, such as silicon nitride film or silicon oxide film can be provided. On top of insulating plate 31, there is a conductive electrode 32 for electrical connection with bonding wires 21 and 24. This electrode is formed by printing, vacuum deposition, plating, and the like. Groove 2t can be formed by mechanical processing or sand blasting. In addition, groove 2t can be formed by partially removing the undercoat plating formed on the surface of substrate 2 or it can be provided in a region which is not plated. The width of the groove is preferably 50 micrometers or greater and 1 mm or less. More preferably, it is 100 micrometers or greater and 500 micrometers or less. If the width is too narrow, the connection member can easily get over the groove. If the width is too large, it becomes wasted space. As described above, Implementation mode 3 of the present invention has a connection member 33 which is provided at a separate position from cavity 2u and which connects substrate 2 with terminal plate 34. Substrate 2 is provided with a groove 2t as a means for preventing connection member 33 from flowing into cavity 2u. With this construction, the semiconductor device of Implementation mode 3 of the present invention prevents reduction in light emitting efficiency of the device by preventing the connection member from covering the metal layer in the cavity.

EMBODIMENTS

With the embodiments, using semiconductor devices 100 shown in FIGS. 1, 7, and 8, the temperatures of semiconductor light emitting elements 1 when semiconductor light emitting elements 1 were illuminated were measured.

Embodiment 1

First, a semiconductor device 100 having a construction as shown in FIG. 7 was prepared. The substrate was constructed from a composite material containing copper at 15% by mass and tungsten at 85% by mass, and the semiconductor light emitting element 1 was a GaN series compound semiconductor light emitting diode. Bottom surface 2b of semiconductor device 100 was mounted on top of a copper frame. Using materials described above, and having various measurements for dimension Y of substrate 2, dimension L (length L of the long side) of the element, and substrate thickness H (distance H from element mounting surface 2a to bottom surface 2b), the samples shown in Table 1 were prepared.

The semiconductor light emitting elements 1 from Samples 1 through 10 were illuminated with a current of 1A. After one minute of illumination, temperatures T1 were measured by using a radiation thermometer (non-contact). Illumination was continued, and after three minutes of illumination, measurements for temperature T3 were taken for each of Samples 1 through 10. The rate of temperature increase ((T3−T1)/T1) were measured for each of Samples 1 through 10. These results are also shown in Table 1. With regard to the rate of temperature increase shown in Table 1, the double circle indicates that the rate of temperature increase was less than 10%. A single circle indicates that the rate of temperature increase was less than 20%. An X indicates that the rate of temperature increase was 20% or greater. As seen from Table 1, Sample 2, which is outside the scope of the present invention, had a large rate of temperature increase. As a result, it can be seen the heat releasing property for Sample 2 was poor. For all other samples, because they are within the scope of the present invention, it can be seen that the rate of temperature increase is suitably controlled. In particular, although it is not shown in the table, Samples 5 through 7 had a rate of temperature increase of 5% or less.

TABLE 1

| Sample No. | Substrate dimension Y (mm) | Element dimension L (mm) | Substrate thickness H (mm) | H/L | Rate of temperature increase |
|---|---|---|---|---|---|
| 1 | 3 | 1 | 1 | 1 | ⊚ |
| 2 | 3 | 1 | 0.2 | 0.2 | X |
| 3 | 3 | 1 | 0.3 | 0.3 | ○ |
| 4 | 3 | 1 | 0.45 | 0.45 | ○ |
| 5 | 3 | 1 | 0.5 | 0.5 | ⊚ |
| 6 | 3 | 1 | 0.75 | 0.75 | ⊚ |
| 7 | 3 | 1 | 1.25 | 1.25 | ⊚ |
| 8 | 3 | 1 | 1.5 | 1.5 | ⊚ |
| 9 | 3 | 1 | 2 | 2 | ⊚ |
| 10 | 2 | 1 | 1 | 1 | ⊚ |

In addition, samples with the substrate construction of FIG. 1 were prepared. The substrates were approximately the same size as the above substrates and were made of composite material containing Al at 30% by mass and SiC at 70% by mass. Si semiconductor elements of approximately the same size as the light emitting element described above were used. The samples were in the approximately the same range of H/L as above. By following approximately the same steps and in the approximately same H/L range as described above, when the rate of temperature increase was confirmed, results with the same trends as described above were obtained.

The implementation modes disclosed are all examples and are not restrictive. The scope of the present invention is indicated in the Claims and is not limited to the above description. Any modifications within the scope and spirit of the claims can be made.

INDUSTRIAL APPLICABILITY

According to the present invention, a semiconductor device that can adequately remove heat generated by the semiconductor element is provided. In addition, with the semiconductor device equipped with a light emitting element, a semiconductor device with excellent light emitting efficiency is provided.

The invention claimed is:

1. A semiconductor device, comprising:
   a semiconductor element with an area for a main surface of 1 mm² or greater;
   a substrate having a thermal conductivity of 170 W/m-K or greater and having an upper surface on which said element is mounted and a bottom surface which is positioned on the opposite side; and
   a ratio H/L being greater than or equal to 0.3 but less than 1.25, with L being the length in the long direction of a main surface of said semiconductor element, and H being the distance from a semiconductor element mounting part on said upper surface of said substrate to said bottom surface.

2. The semiconductor device according to claim 1, further comprising:
   a ratio of Y/L being equal to or greater than 2, with Y being the distance from one end of the bottom surface of the substrate to the opposite end of the bottom surface of the substrate along the same plane as L.

3. The semiconductor device according to claim 1, wherein the thermal conductivity of the substrate is equal to or greater than 200 W/m-K.

4. The semiconductor device according to claim 1, wherein the ratio H/L is greater than 0.45 but less than 1.25.

5. The semiconductor device according to claim 1, wherein the distance H is greater than or equal to 0.3 mm but less than or equal to 10 mm.

6. A semiconductor device, comprising:
   a semiconductor element with an area for a main surface of 1 mm² or greater;
   a substrate having a thermal conductivity of 170 W/m-K or greater and having an upper surface on which the semiconductor element is mounted and a bottom surface which is positioned on the opposite side;
   a metal layer formed on the upper surface of the substrate; and
   a ratio H/L being greater than 0.3 but less than 1.25, with L being the length in the long direction of a main surface of said semiconductor element, and H being the distance from a semiconductor element mounting part on said upper surface of said substrate to said bottom surface.

7. The semiconductor device according to claim 6, wherein a maximum roughness Rmax of the metal layer is in a range of 0.1 to 20 micrometers.

8. The semiconductor device according to claim 6, further comprising:
   a hole formed in the substrate;
   a pin disposed within the hole that supplies power to the semiconductor element; and
   an insulating material which fills a space between the inner surface of the hole and the pin.

9. The semiconductor device according to claim 6, further comprising:
   a terminal plate that supplies power to the semiconductor element;
   a connection member which connects between the substrate and the terminal plate.

* * * * *